United States Patent
Mitani et al.

(10) Patent No.: US 9,437,258 B2
(45) Date of Patent: Sep. 6, 2016

(54) DATA READOUT CIRCUIT OF A STORAGE DEVICE FOR READ-OUT OPERATION FOR PREVENTING ERRONEOUS WRITING INTO A DATA STORAGE ELEMENT AND READING OUT OF THE DATA CORRECTLY

(71) Applicant: Seiko Instruments Inc., Chiba-shi, Chiba (JP)

(72) Inventors: Makoto Mitani, Chiba (JP); Kotaro Watanabe, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 14/844,921

(22) Filed: Sep. 3, 2015

(65) Prior Publication Data
US 2016/0071559 A1 Mar. 10, 2016

(30) Foreign Application Priority Data
Sep. 9, 2014 (JP) ................. 2014-183405

(51) Int. Cl.
*G11C 7/00* (2006.01)
*G11C 7/06* (2006.01)
*G11C 7/10* (2006.01)
*G11C 7/22* (2006.01)

(52) U.S. Cl.
CPC ............... *G11C 7/062* (2013.01); *G11C 7/067* (2013.01); *G11C 7/106* (2013.01); *G11C 7/22* (2013.01)

(58) Field of Classification Search
CPC ...... G11C 7/1051; G11C 7/1078; G11C 7/22
USPC .................. 365/189.05, 189.07, 189.09
IPC .................. G11C 7/1051, 7/1078, 7/22
See application file for complete search history.

(56) References Cited

U.S. PATENT DOCUMENTS

| 7,656,713 B2* | 2/2010 | Cernea ............... G11C 7/02 365/185.17 |
| 9,310,775 B2* | 4/2016 | Mitani ............... G04F 5/04 |
| 2010/0208531 A1 | 8/2010 | Watanabe |
| 2014/0219037 A1* | 8/2014 | Mitani ............... G11C 29/028 365/189.05 |

* cited by examiner

*Primary Examiner* — Connie Yoha
(74) *Attorney, Agent, or Firm* — Brinks Gilson & Lione

(57) ABSTRACT

Provided is a data readout circuit capable of, even when a high voltage is applied during data read-out operation, preventing erroneous writing of the data and reading out the data correctly. The data readout circuit includes: a non-volatile storage element; a latch circuit including: an input inverter; an output inverter; and a MOS transistor; a first MOS transistor connected between the non-volatile storage element and the latch circuit; a second MOS transistor connected between the latch circuit and the first power supply terminal; a first bias circuit configured to bias a gate of the first MOS transistor; and a second bias circuit configured to bias the MOS transistor in the latch circuit, each of the first bias circuit and the second bias circuit being configured to output a predetermined bias voltage when the data in the non-volatile storage element is read out.

4 Claims, 6 Drawing Sheets

READOUT OF DATA "1"

READOUT OF DATA "0"

DATA READOUT CIRCUIT OF A STORAGE DEVICE FOR READ-OUT OPERATION FOR PREVENTING ERRONEOUS WRITING INTO A DATA STORAGE ELEMENT AND READING OUT OF THE DATA CORRECTLY

RELATED APPLICATIONS

This application claims priority under 35 U.S.C. §119 to Japanese Patent Application No. 2014-183405 filed on Sep. 9, 2014, the entire content of which is hereby incorporated by reference.

BACKGROUND OF THE INVENTION

1. Field of the Invention

The present invention relates to a data readout circuit, and more specifically, to a technology of, when a high voltage is applied to a circuit during data read-out operation, preventing erroneous writing into a data storage element and reading out the data correctly.

2. Description of the Related Art

FIG. 6 is a circuit diagram for illustrating a related-art data readout circuit of a storage device.

A PMOS transistor 11 has a source terminal connected to a power supply terminal VDD on a high voltage side. A PMOS OTP element 13 serving as a non-volatile storage element has a source terminal connected to a drain terminal of the PMOS transistor 11, and a drain terminal connected to a source terminal of a PMOS transistor 12. To a data output terminal DOUT, input and output terminals of a latch circuit 20, a drain terminal of the PMOS transistor 12, and a drain terminal of an NMOS transistor 14 are connected. The NMOS transistor 14 has a source terminal connected to a power supply terminal VSS on a low voltage side. The related-art data readout circuit of the storage device is described on the assumption that the power supply terminal VDD has a GND voltage.

A signal Φ1 is input to gates of the PMOS transistors 11 and 12, and a signal Φ2 is input to a gate of the NMOS transistor 14.

Next, an operation of the related-art data readout circuit is described.

In an initial state, the signal Φ1 is at High (VDD) level and the signal Φ2 is at Low (VSS) level, and the PMOS transistors 11 and 12 and the NMOS transistor 14 are turned off. A potential of the data output terminal DOUT is at a level of data held by the latch circuit 20, which is previously read out.

First, the signal Φ2 is set to High level to turn on the NMOS transistor 14, so that the data output terminal DOUT becomes Low level. Then, the signal Φ2 is set to Low level to turn off the NMOS transistor 14.

Next, the signal Φ1 is set to Low level to turn on the PMOS transistors 11 and 12. Consequently, data in the PMOS OTP element 13 is read out to the data output terminal DOUT, and at the same time, the data is held by the latch circuit 20. Then, the signal Φ1 is set to High level to turn off the PMOS transistors 11 and 12, but the state of the data output terminal DOUT is maintained by the latch circuit 20.

In a period of reading out data in the PMOS OTP element 13, which is 1, a voltage Vds applied between the drain and the source of the PMOS OTP element 13 is expressed by Expression (1).

$$Vds = |VSS| - (|Vth12| + |Vov12|) \quad (1)$$

In Expression (1), Vth12 and Vov12 represent a threshold voltage and an overdrive voltage of the PMOS transistor 12, respectively. In general, the threshold voltage Vth12 is approximately −0.5 V and the overdrive voltage Vov12 is approximately −0.1 V. The drain-source voltage Vds of the PMOS OTP element 13 is −1 V when the data readout circuit is operated with a voltage of the power supply terminal VSS being −1.6 V.

However, Expression (1) depends on |VSS|. Thus, there is a problem in that, when a high voltage is applied between the power supply and the data readout circuit in a period of reading out data due to static electricity and the like, for example, the drain-source voltage Vds of the PMOS OTP element 13 is increased, and the data is erroneously written when the voltage exceeds a write voltage.

Moreover, in the related-art data readout circuit, a current of an NMOS transistor 32 (latch current), which forms the latch circuit 20 is increased with the square of a power supply voltage. On the other hand, however, a current flowing through the PMOS transistor 11, the PMOS OTP element 13, and the PMOS transistor 12 connected in series (OTP on current) is not increased so much even when the power supply voltage is increased, because a gate voltage of the PMOS OTP element 13 is a floating voltage. Thus, there is a problem in that the latch current may become larger than the OTP on current when the power supply voltage is high, with the result that data "1" cannot be read out.

SUMMARY OF THE INVENTION

The present invention has been made in view of those problems, and provides a data readout circuit capable of, even when a high voltage is applied as a power supply voltage during data read-out operation, preventing erroneous writing of the data into a non-volatile memory and reading out the data correctly.

In order to solve the related-art problems, according to one embodiment of the present invention, there is provided a data readout circuit, including: a non-volatile storage element; a latch circuit including: an input inverter; an output inverter; and a MOS transistor; a first MOS transistor connected between the non-volatile storage element and the latch circuit; a second MOS transistor connected between the latch circuit and the first power supply terminal; a first bias circuit configured to bias a gate of the first MOS transistor; and a second bias circuit configured to bias the MOS transistor in the latch circuit, each of the first bias circuit and the second bias circuit being configured to output a predetermined bias voltage when the data in the non-volatile storage element is read out.

According to one embodiment of the present invention, there may be provided the data readout circuit capable of, even when the high voltage is applied as the power supply voltage during the data read-out operation, preventing erroneous writing of the data into the non-volatile memory and reading out the data correctly.

DETAILED DESCRIPTION OF THE PREFERRED EMBODIMENTS

Now, a data readout circuit according to each of embodiments of the present invention is described with reference to the drawings. The data readout circuit is described on the assumption that a power supply terminal VDD has a GND voltage.

First Embodiment

Figure 1:
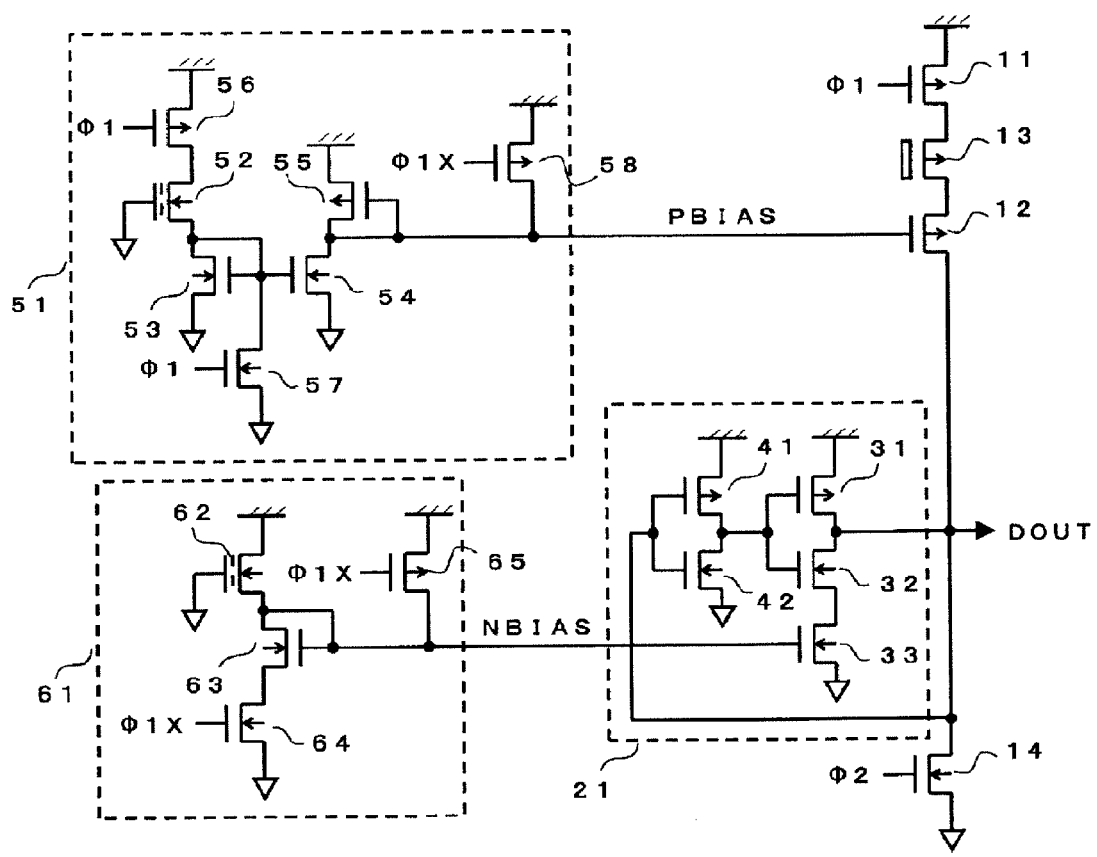
FIG. 1 is a diagram for illustrating a data readout circuit according to a first embodiment of the present invention.

FIG. 1 is a circuit diagram for illustrating a data readout circuit according to a first embodiment of the present invention.

First, components and connections in the data readout circuit of this embodiment are described.

The data readout circuit of this embodiment includes a PMOS OTP element 13 that is an example of a non-volatile storage element, a PMOS transistor 11, a PMOS transistor 12, a latch circuit 21, and bias circuits 51 and 61.

The PMOS transistor 11 has a source terminal connected to the power supply terminal VDD on a high voltage side. The PMOS OTP element 13 has a source terminal connected to a drain terminal of the PMOS transistor 11, and a drain terminal connected to a source terminal of the PMOS transistor 12. To a data output terminal DOUT, input and output terminals of the latch circuit 21, a drain terminal of the PMOS transistor 12, and a drain terminal of an NMOS transistor 14 are connected. The NMOS transistor 14 has a source terminal connected to a power supply terminal VSS on a low voltage side. The source terminal of the PMOS transistor 12 is connected to the drain terminal of the PMOS OTP element 13. A signal Φ1 is input to a gate of the PMOS transistor 11. A signal Φ2 is input to a gate of the NMOS transistor 14.

The latch circuit 21 includes PMOS transistors 31 and 41 and NMOS transistors 32, 33, and 42. An inverter formed by the PMOS transistor 41 and the NMOS transistor 42 has an input terminal connected to the data output terminal DOUT, and an output terminal connected to an input terminal of an inverter formed by the PMOS transistor 31 and the NMOS transistor 32. The inverter formed by the PMOS transistor 31 and the NMOS transistor 32 has an output terminal connected to the data output terminal DOUT. The NMOS transistor 33 is connected between a source of the NMOS transistor 32 and the power supply terminal VSS, and has a gate terminal connected to a node NBIAS.

The bias circuit 51 supplies a bias voltage to the gate of the PMOS transistor 12 (node PBIAS).

The bias circuit 51 includes a depression type NMOS transistor 52, NMOS transistors 53, 54, and 57, and PMOS transistors 55, 56, and 58.

The depression type NMOS transistor 52 has a gate terminal connected to the power supply terminal VSS, and a source terminal connected to a gate terminal and a drain terminal of the NMOS transistor 53 and a gate terminal of the NMOS transistor 54. The NMOS transistors 53 and 54 each have a source terminal connected to the power supply terminal VSS. Further, the NMOS transistors 53 and 54 form a current mirror circuit. The PMOS transistor 55 has a gate terminal and a drain terminal connected to a drain terminal of the NMOS transistor 54 and the node PBIAS, and a source terminal connected to the power supply terminal VDD.

An enable function of the bias circuit 51 is achieved by the PMOS transistors 56 and 58 and the NMOS transistor 57. The PMOS transistor 56 is connected between a drain terminal of the depression type NMOS transistor 52 and the power supply terminal VDD. The signal Φ1 is input to a gate terminal of the PMOS transistor 56. The NMOS transistor 57 is connected between the gate terminal of the NMOS transistor 53 and the power supply terminal VSS. The signal Φ1 is input to a gate terminal of the NMOS transistor 57. The PMOS transistor 58 is connected between the node PBIAS and the power supply terminal VDD. A signal Φ1X is input to a gate terminal of the PMOS transistor 58. The signal Φ1X is a signal obtained by inverting the signal Φ1.

The bias circuit 61 supplies a bias voltage to the gate of the NMOS transistor 33 in the latch circuit 21 (node NBIAS).

The bias circuit 61 includes a depression type NMOS transistor 62, NMOS transistors 63 and 64, and a PMOS transistor 65.

The depression type NMOS transistor 62 has a gate terminal connected to the power supply terminal VSS, a drain terminal connected to the power supply terminal VDD, and a source terminal connected to a gate terminal and a drain terminal of the NMOS transistor 63.

An enable function of the bias circuit 61 is achieved by the PMOS transistor 65 and the NMOS transistor 64. The NMOS transistor 64 is connected between a source terminal of the NMOS transistor 63 and the power supply terminal VSS. The signal Φ1X is input to a gate terminal of the NMOS transistor 64. The PMOS transistor 65 is connected between the node NBIAS and the power supply terminal VDD. The signal Φ1X is input to a gate terminal of the PMOS transistor 65.

Next, a readout operation of the data readout circuit of the first embodiment is described.

The bias circuits 51 and 61 are enabled when the signal Φ1 is at Low level (the signal Φ1X is at High level), thereby outputting the bias voltages to the nodes PBIAS and NBIAS, respectively. On the other hand, the bias circuits 51 and 61 are disenabled when the signal Φ1 is at High level (the signal Φ1X is at Low level), thereby outputting the voltage of the power supply terminal VDD to the nodes PBIAS and NBIAS, respectively.

Figure 2:
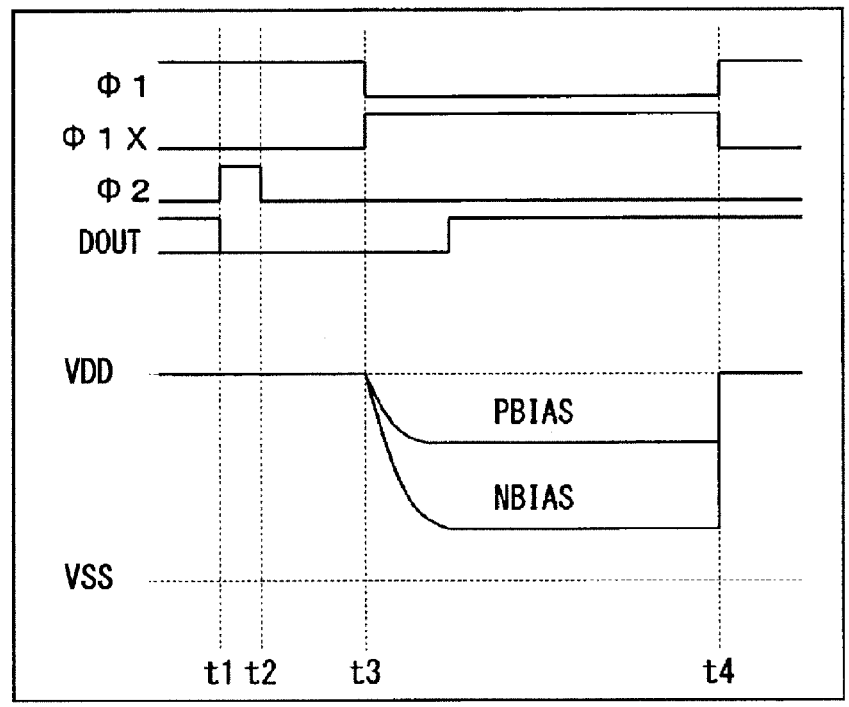
FIG. 2 is a timing chart for illustrating a readout operation of the data readout circuit of the first embodiment.
Figure 2:
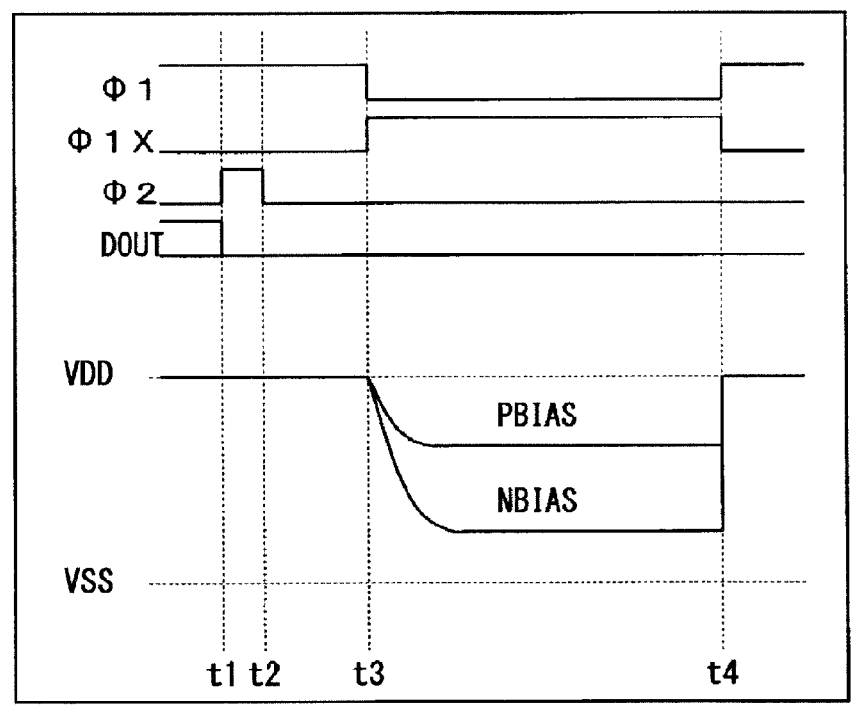

FIG. 2 is a timing chart for illustrating the readout operation of the data readout circuit of the first embodiment.
<Description of Operation of Reading out Data "1">

In a period of t<t1, the signal Φ1 is at High level and the signal Φ2 is at Low level, and the PMOS transistor 11 and the NMOS transistor 14 are turned off. The bias circuits 51 and 61 are in the disenable state, and the nodes PBIAS and NBIAS each have the voltage of the power supply terminal VDD. Consequently, the PMOS transistor 12 is turned off, and the data output terminal DOUT is at a voltage level of data held by the latch circuit 21.

In a period of t1<t<t2, the signal Φ2 is set to High level to turn on the NMOS transistor 14 so that the data in the latch circuit 21 and the data output terminal DOUT are reset to Low level. In a period of t2<t<t3, the signal Φ2 is set to Low level to turn off the NMOS transistor 14. In this manner, the data readout is ready.

In a period of t3<t<t4, the signal Φ1 is set to Low level to turn on the PMOS transistor 11. The bias circuit 51 is enabled to output a predetermined bias voltage to the node PBIAS. The bias circuit 61 is enabled to output a predetermined bias voltage to the node NBIAS.

The PMOS OTP element 13 stores data "1" and is thus in a conductive state. Consequently, the data output terminal DOUT is raised to High level through the PMOS transistor 12. In this case, in order to raise the data output terminal DOUT to High level, the data readout circuit is designed such that a current flowing through the PMOS transistor 11, the PMOS OTP element 13, and the PMOS transistor 12 connected in series (OTP on current) is larger than a current flowing through the NMOS transistors 32 and 33 connected in series (latch current), the NMOS transistors 32 and 33 forming the latch circuit 21.

In a period of t4<t, the signal Φ1 is set to High level to turn off the PMOS transistor 11. Moreover, the bias circuits 51 and 61 are disenabled and the PMOS transistor 12 is turned off, but the data output terminal DOUT continues to be maintained at High level by the latch circuit 21.

Through the operation described above, the data "1" is read out from the data output terminal DOUT of the data readout circuit.

<Description of Operation of Reading out Data "0">

A description of an operation in the period of t<t3, which is the same as that of the operation of reading out the data 1, is omitted.

In the period of t3<t<t4, the signal Φ1 is set to Low level to turn on the PMOS transistor 11. The bias circuit 51 is enabled to output a predetermined bias voltage to the node PBIAS. The bias circuit 61 is enabled to output a predetermined bias voltage to the node NBIAS.

The PMOS OTP element 13 stores data "0" and is thus in a non-conductive state. Consequently, the data output terminal DOUT is maintained at Low level.

In the period of t4<t, the signal Φ1 is set to High level to turn off the PMOS transistor 11. Moreover, the bias circuits 51 and 61 are disenabled and the PMOS transistor 12 is turned off, but the data output terminal DOUT continues to be maintained at Low level by the latch circuit 21.

Through the operation described above, the data "0" is read out from the data output terminal DOUT of the data readout circuit.

Now, an operation of reading out data performed when the power supply voltage is the high voltage is described.

The signal Φ1 is set to Low level so that the bias circuits 51 and 61 are enabled. In this case, the nodes PBIAS and NBIAS have predetermined bias voltages independent of the power supply voltage, and hence the latch current flowing through the latch circuit 21 and the OTP on current flowing through the PMOS OTP element 13 are independent of the power supply voltage. Consequently, even when the power supply voltage is the high voltage, data can be correctly read out from the data output terminal DOUT of the data readout circuit.

Moreover, the OTP on current and the latch current depend on the bias currents of the bias circuits 51 and 61. The bias current of the bias circuit 51 is determined by threshold voltages of the depression type NMOS transistor 52 and the NMOS transistor 53. Similarly, the bias current of the bias circuit 61 is determined by threshold voltages of the depression type NMOS transistor 62 and the NMOS transistor 63. Consequently, even when the threshold voltages vary in the manufacturing process, the OTP on current and the latch current vary in the same direction. Thus, a magnitude relationship between the OTP on current and the latch current is maintained. A greater effect is obtained when the depression type NMOS transistors 52 and 62 are arranged near the NMOS transistors 53 and 63 in the same direction, respectively in the semiconductor chip.

Next, a description is given of how erroneous writing into the non-volatile storage element (PMOS OTP element 13) is prevented during the operation of reading out data performed when the power supply voltage is the high voltage.

A voltage Vds applied between the drain and the source of the PMOS OTP element 13 is expressed by Expression (2).

$$Vds = |VPBIAS| - (|Vth12| + |Vov12|) \qquad (2)$$

In Expression (2), Vth12 and Vov12 represent a threshold voltage and an overdrive voltage of the PMOS transistor 12, respectively. VPBIAS represents the bias voltage of the node PBIAS. In general, the threshold voltage Vth12 is approximately −0.5 V and the overdrive voltage Vov12 is approximately −0.1 V. When the bias voltage VPBIAS is set to −1.2 V, for example, the drain-source voltage of the PMOS OTP element 13 is −0.6 V. In other words, Expression (2) does not depend on the power supply voltage, and hence the drain-source voltage Vds of the PMOS OTP element 13 does not change and remains at −0.6 V even when the high voltage is applied as the power supply voltage. Consequently, even when the high voltage is applied between the power supply and the data readout circuit in the period of reading out data due to static electricity and the like, the erroneous writing into the PMOS OTP element 13 can be prevented.

Second Embodiment

Figure 3:
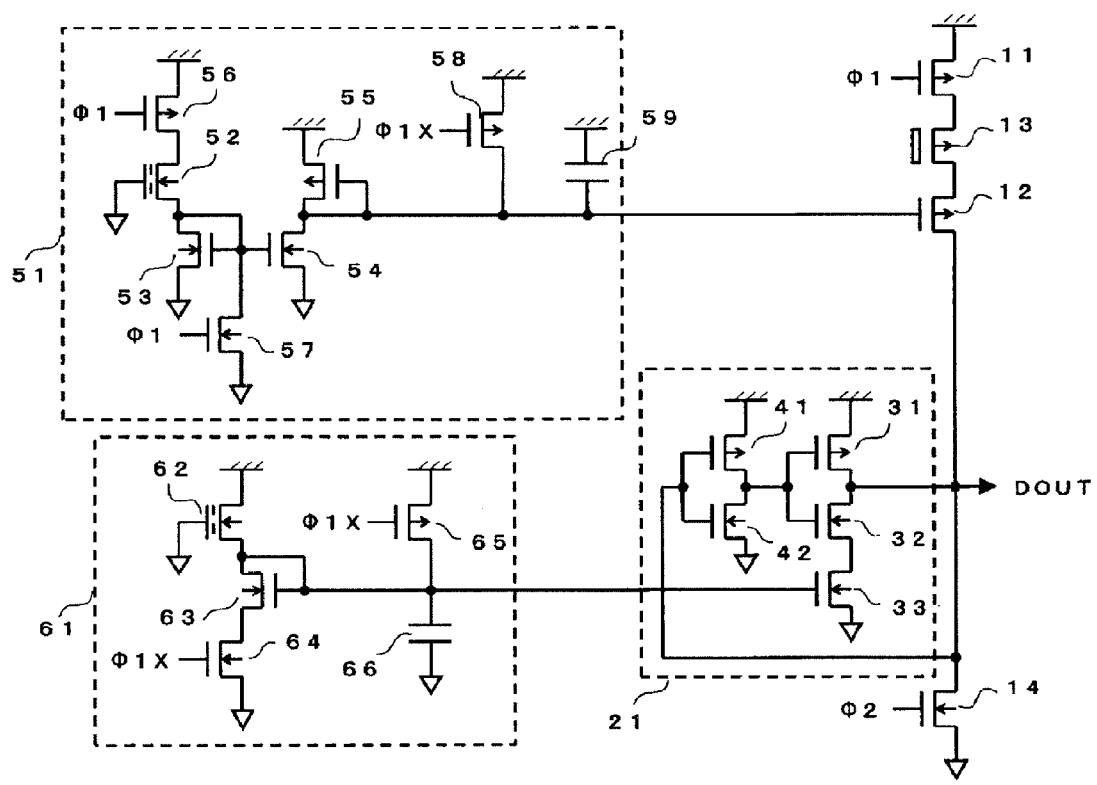
FIG. 3 is a diagram for illustrating a data readout circuit according to a second embodiment of the present invention.

FIG. 3 is a circuit diagram for illustrating a data readout circuit according to a second embodiment of the present invention.

The same components as those of FIG. 1 are denoted by the same reference symbols. FIG. 3 differs from FIG. 1 in that the bias circuit 51 includes a capacitor 59 and the bias circuit 61 includes a capacitor 66.

The capacitor 59 is connected between the node PBIAS and the power supply terminal VDD. The capacitor 66 is connected between the node NBIAS and the power supply terminal VSS. The capacitors 59 and 66 provide an effect of stabilizing the voltages of the nodes PBIAS and NBIAS. For example, when a transitional undershoot occurs in the node PBIAS at the time of activating the bias circuit 51 during which the voltage of the node PBIAS changes from the voltage of the power supply terminal VDD to a predetermined bias voltage, the drain-source voltage of the PMOS OTP element 13 is increased. If the high voltage is applied as the power supply voltage at this timing, data may be erroneously written into the PMOS OTP element 13. Moreover, when a transitional undershoot occurs in the node NBIAS at the time of activating the bias circuit 61 during which the voltage of the node NBIAS changes from the voltage of the power supply terminal VDD to a predetermined bias voltage, the data "0" held by the latch circuit 21 becomes unstable. For example, the data in the latch circuit 21 may be erroneously inverted due to an influence of noise.

The capacitors 59 and 66 provide effects of preventing the undershoots of the nodes PBIAS and NBIAS and improving the noise resistances of the nodes PBIAS and NBIAS, and thus allow the data readout circuit to be operated more stably. Moreover, not only the time of activating the bias circuit, but also the time of reading out the data "1" or the time of inverting the latch circuit 21, the voltages of the nodes PBIAS and NBIAS may vary through a parasitic capacitor in the circuit. This embodiment is more effective for a case where the pair of bias circuits 51 and 61 reads out a plurality of bits.

Third Embodiment

Figure 4:
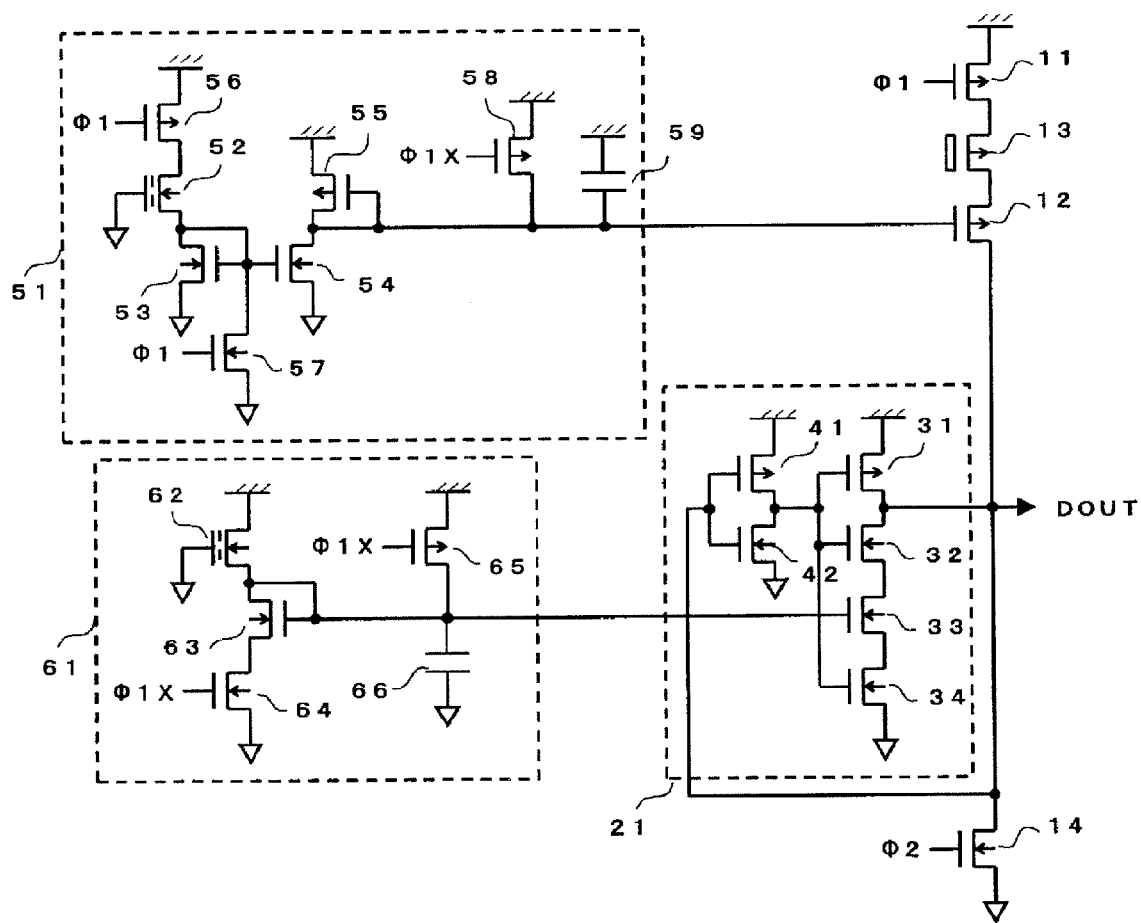
FIG. 4 is a diagram for illustrating a data readout circuit according to a third embodiment of the present invention.

FIG. 4 is a circuit diagram for illustrating a data readout circuit according to a third embodiment of the present invention.

The same components as those of FIG. 3 are denoted by the same reference symbols. FIG. 4 differs from FIG. 3 in that the data readout circuit includes an NMOS transistor 34 on the source side of the NMOS transistor 33 in the latch circuit 21, and a gate terminal of the NMOS transistor 34 is connected to a drain terminal of the NMOS transistor 42. With this, the mirror accuracy of a current mirror circuit formed by the NMOS transistor 63 and the NMOS transistor 33 is improved, and hence the data readout circuit can be operated more stably. A greater effect is obtained when the size ratio between the NMOS transistor 64 and the NMOS transistor 34 is set to the same as the size ratio between the NMOS transistor 63 and the NMOS transistor 33.

Fourth Embodiment

Figure 5:
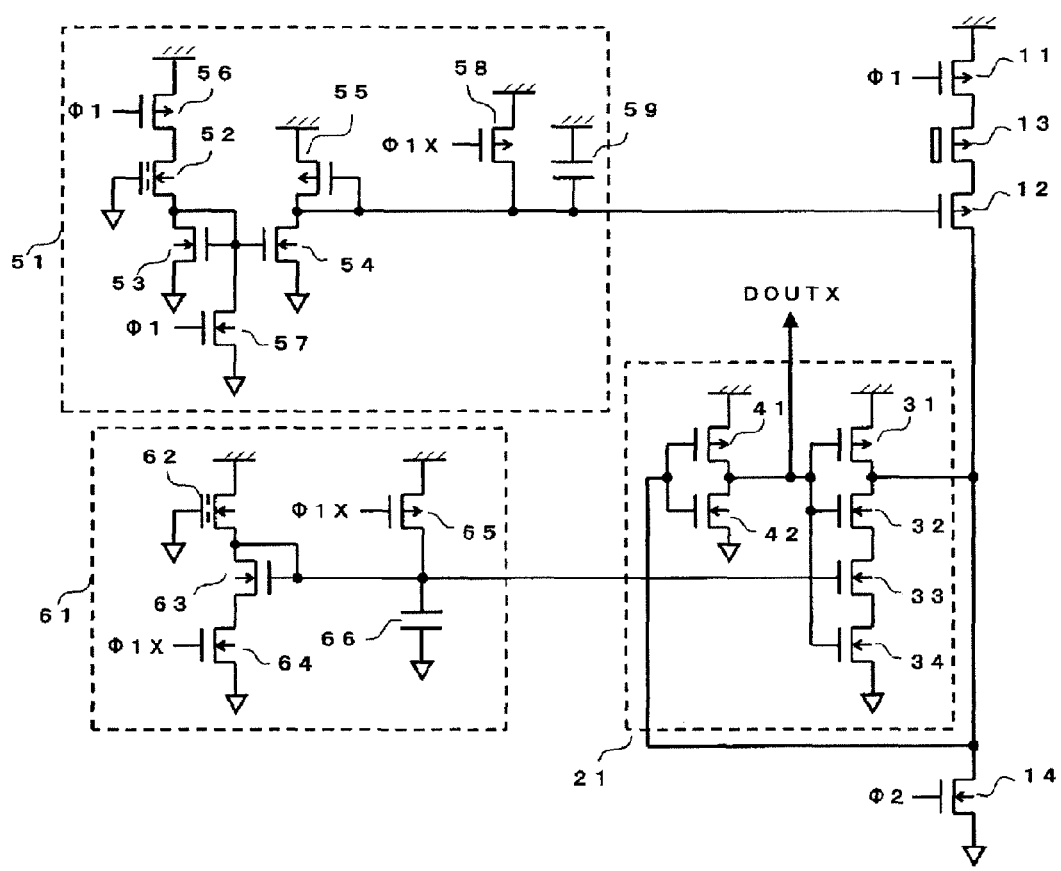
FIG. 5 is a diagram for illustrating a data readout circuit according to a fourth embodiment of the present invention.
Figure 6:
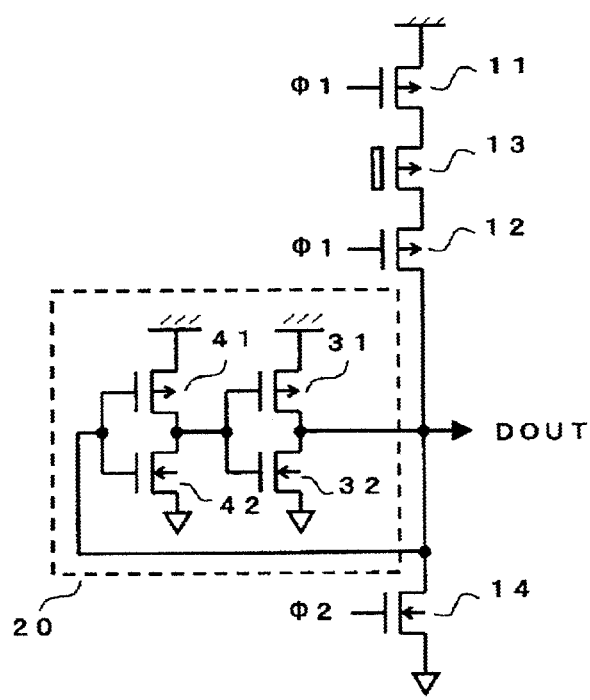
FIG. 6 is a diagram for illustrating a related-art data readout circuit.

FIG. 5 is a circuit diagram for illustrating a data readout circuit according to a fourth embodiment of the present invention.

The same components as those of FIG. 4 are denoted by the same reference symbols. FIG. 5 differs from FIG. 4 in that the data output terminal is led out, as a data output terminal DOUTX, from an output of an inverter formed by the PMOS transistor 41 and the NMOS transistor 42 in the latch circuit 21.

The latch current, which flows through the NMOS transistors 32 and 33 connected in series during the readout period, is a constant current, and hence the data output terminal DOUT has relatively high impedance. Wiring of the data output terminal DOUT is sometimes routed to another logic circuit block (not shown) configured to process read data, and when the impedance is high, the noise resistance is low and the data in the latch circuit 21 may be erroneously inverted. In this embodiment, the data is read out from the data output terminal DOUTX having low impedance, and hence the data readout circuit can be operated more stably.

Note that, specific configurations of the bias circuits 51 and 61 are not limited to the circuit configurations described in those embodiments, and the bias circuits 51 and 61 may be formed within a range that does not depart from Scope of Claims.

What is claimed is:

1. A data readout circuit, comprising:
   a non-volatile storage element;
   a latch circuit comprising:
      an input inverter;
      an output inverter; and
      a third MOS transistor connected between the output inverter and a first power supply terminal,
      the latch circuit being configured to hold data in the non-volatile storage element;
   a first MOS transistor directly connected to the non-volatile storage element and directly connected to the latch circuit;
   a second MOS transistor directly connected to the latch circuit and the first power supply terminal;
   a first bias circuit configured to bias a gate of the first MOS transistor; and
   a second bias circuit configured to bias the third MOS transistor in the latch circuit,
   each of the first bias circuit and the second bias circuit being configured to output a predetermined bias voltage when the data in the non-volatile storage element is read out.

2. A data readout circuit according to claim 1, further comprising:
   a first capacitor connected between an output terminal of the first bias circuit and a second power supply terminal; and
   a second capacitor connected between an output terminal of the second bias circuit and the first power supply terminal.

3. A data readout circuit according to claim 1, wherein the data in the non-volatile storage element is read out from an output terminal of the input inverter in the latch circuit.

4. A data readout circuit according to claim 2, wherein the data in the non-volatile storage element is read out from an output terminal of the input inverter in the latch circuit.

* * * * *